United States Patent
Shinozaki

(10) Patent No.: US 6,337,819 B1
(45) Date of Patent: Jan. 8, 2002

(54) SEMICONDUCTOR DEVICE HAVING ON-CHIP TERMINAL WITH VOLTAGE TO BE MEASURED IN TEST

(75) Inventor: Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/551,570

(22) Filed: Apr. 18, 2000

(30) Foreign Application Priority Data

Apr. 28, 1999 (JP) .............................. 11-121656

(51) Int. Cl.$^7$ ................................ G11C 7/00
(52) U.S. Cl. ..................... 365/201; 714/25; 714/42; 714/718; 714/721
(58) Field of Search ............. 365/201; 714/25, 714/42, 718, 721

(56) References Cited

U.S. PATENT DOCUMENTS 6,212,089 B1 * 4/2001 Kajigaya et al. ............... 365/51

FOREIGN PATENT DOCUMENTS

| JP | 356079267 | * | 6/1981 |
| JP | 402306179 A | * | 12/1990 |
| JP | 403076407 | * | 4/1991 |
| JP | 410038982 A | * | 2/1998 |
| JP | 411211787 | * | 8/1999 |
| JP | 0200004859 | * | 2/2000 |

* cited by examiner

Primary Examiner—Viet Q. Nguyen
(74) Attorney, Agent, or Firm—Arent Fox Kintner Plotkin & Kahn, PLLC

(57) ABSTRACT

A step-down circuit 10A comprises a voltage follower circuit 20A for receiving a voltage VG, to be measured, of an internal circuit, activated in response to activation of a test mode signal TM, and providing its output to an on-chip pad 16A. Although a large current flows through an output buffer circuit 22 of the voltage follower circuit 20A compared with that of an output buffer circuit 15 of a voltage control circuit 12, this large current does not flow when the signal TM is inactive. The voltage follower circuit having a comparatively large area on chip can commonly be used with a selection circuit for selecting one of nodes with voltages to be measured. In a case of SDRAM, the signal TM may be an output of the command decoder and a selection control signal may be an address signal.

13 Claims, 5 Drawing Sheets

SEMICONDUCTOR DEVICE HAVING ON-CHIP TERMINAL WITH VOLTAGE TO BE MEASURED IN TEST

BACKGROUND OF THE INVENTION

1. Field of the Invention

The present invention relates to a semiconductor device having an on-chip terminal with a voltage to be measured in a test.

2. Description of the Related Art

FIG. 5 shows a step-down circuit 10 included in a semiconductor device.

This circuit is used for providing an internal power supply voltage VII, obtained by stepping down an external power supply voltage VCC supplied to an external terminal of the circuit, to circuit blocks in the semiconductor device. For example, VCC=5.0 V and VII=3.3 V. A current flows from VCC to an NMOS transistor 11, and the source of the NMOS transistor 11 is the internal power supply voltage VII. The VII is lower than the gate voltage VG of the NMOS transistor 11 by the threshold voltage Vth thereof. Therefore, the gate voltage VG is controlled by a voltage control circuit 12 so as to be constant independently of variations of the voltage VCC and temperature.

In the voltage control circuit 12, a reference voltage Vref produced in a reference voltage generation circuit 14 is provided to the gate of an NMOS transistor 131 in a differential amplification circuit 13. The reference voltage Vref is almost constant independently of variations of the voltage VCC and temperature. The drain voltage of the NMOS transistor 131 is provided to the gate of a PMOS transistor 151 in an output buffer circuit 15 as the output of the differential amplification circuit 13. The voltage of a node N1 connected to the drain of the PMOS transistor 151 is the output VG of the voltage control circuit 12. The voltage VG is lowered by an NMOS transistor 152 in the output buffer circuit 15 by its threshold voltage Vth and provided to the gate of an NMOS transistor 132 in the differential amplification circuit 13. Therefore, the gate voltage of the NMOS transistor 132 is equal to the voltage VII to be controlled.

In the above described configuration, when VII falls down and then VII<Vref, the gate voltage VG and the gate voltage of the NMOS transistor 132 fall as well. With the falls in the voltages, the gate voltage of the PMOS transistor 151 falls to decrease the internal resistance thereof, and the gate voltage VG together with the voltage VII rise. Contrary to this, when VII>Vref, the gate voltage of the PMOS transistor 151 rises to increase the internal resistance thereof, and the gate voltage VG together with the voltage VII fall. By such operation, the voltage VII follows the stabilized reference voltage Vref.

In order to measure the gate voltage VG prior to shipment of the semiconductor device, the node N1 is connected to a pad 16 formed on the semiconductor chip with the pad 16, the probe 18 connected through a cable 19 to a tester 17 is put into contact.

Since the voltage control circuit 12 is only required to control the gate voltage VG of the NMOS transistor 11, the current flowing through the output buffer circuit 15 can be small compared with the current flowing through the NMOS transistor 11 and thereby, low power consumption in the voltage control circuit 12 is realized by use of a larger resistance R1 of the output buffer circuit 15. On the other hand, although the internal resistance Rt of the tester 17 is comparatively large, the combined capacitance of the probe 18 and cable 19 is much larger than that of the node N1.

Hence, when the probe 18 of the tester 17 is put into contact with the pad 16, a change in the gate voltage VG cannot be detected correctly by the tester 17. If a circuit for diminishing an influence of the probe 18 and cable 19 of the tester 17 is incorporated in the step-down circuit 10, power consumption increases in normal operation by a user.

SUMMARY OF THE INVENTION

Accordingly, it is an object of the present invention to provide a semiconductor device, having an on-chip terminal with a voltage to be measured in a test, that makes it possible to more accurately measure the voltage of the terminal without increasing in power consumption in the normal use.

In the present invention, there is provided a semiconductor device comprising: an internal circuit having a node with a voltage to be measured in a test; an on-chip terminal; and a voltage follower circuit, having an input for receiving a voltage of the node, activated in response to activation of a test mode signal, for providing its output to the on-chip terminal.

With the present invention, the node voltage is indirectly measured through the voltage follower circuit and therefore, when the probe of a tester is put into contact with the on-chip terminal such as a pad, the influence of the capacitance of the probe is small, which in turn enables more accurate measurement of the node voltage of the internal circuit.

Further, since the voltage follower circuit is deactivated by deactivating the test mode signal in normal operation, increase in power consumption can be avoided even with the voltage follower circuit provided, otherwise a comparatively large current flows through the voltage follower circuit.

Other aspects, objects, and the advantages of the present invention will become apparent from the following detailed description taken in connection with the accompanying drawings.

DESCRIPTION OF THE PREFERRED EMBODIMENTS

Figure 1:
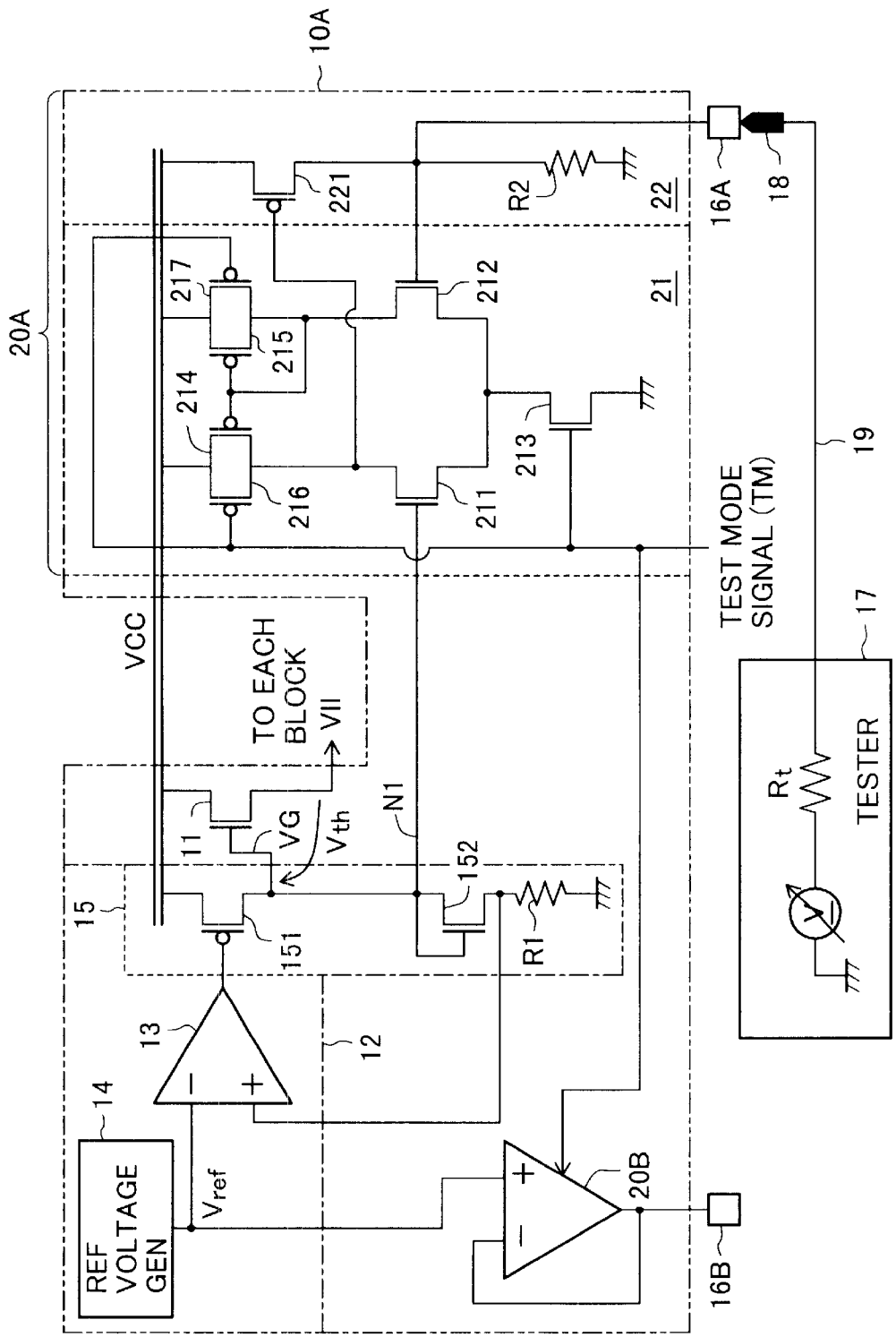
FIG. 1 is a diagram showing a step-down circuit of the first embodiment according to the present invention.

Referring now to the drawings, wherein like reference characters designate like or corresponding parts throughout several views, preferred embodiments of the present invention are described below. A signal which is active low will be denoted with adding * to a reference character.

First Embodiment

FIG. 1 shows a step-down circuit 10A of the first embodiment according to the present invention.

Figure 5:
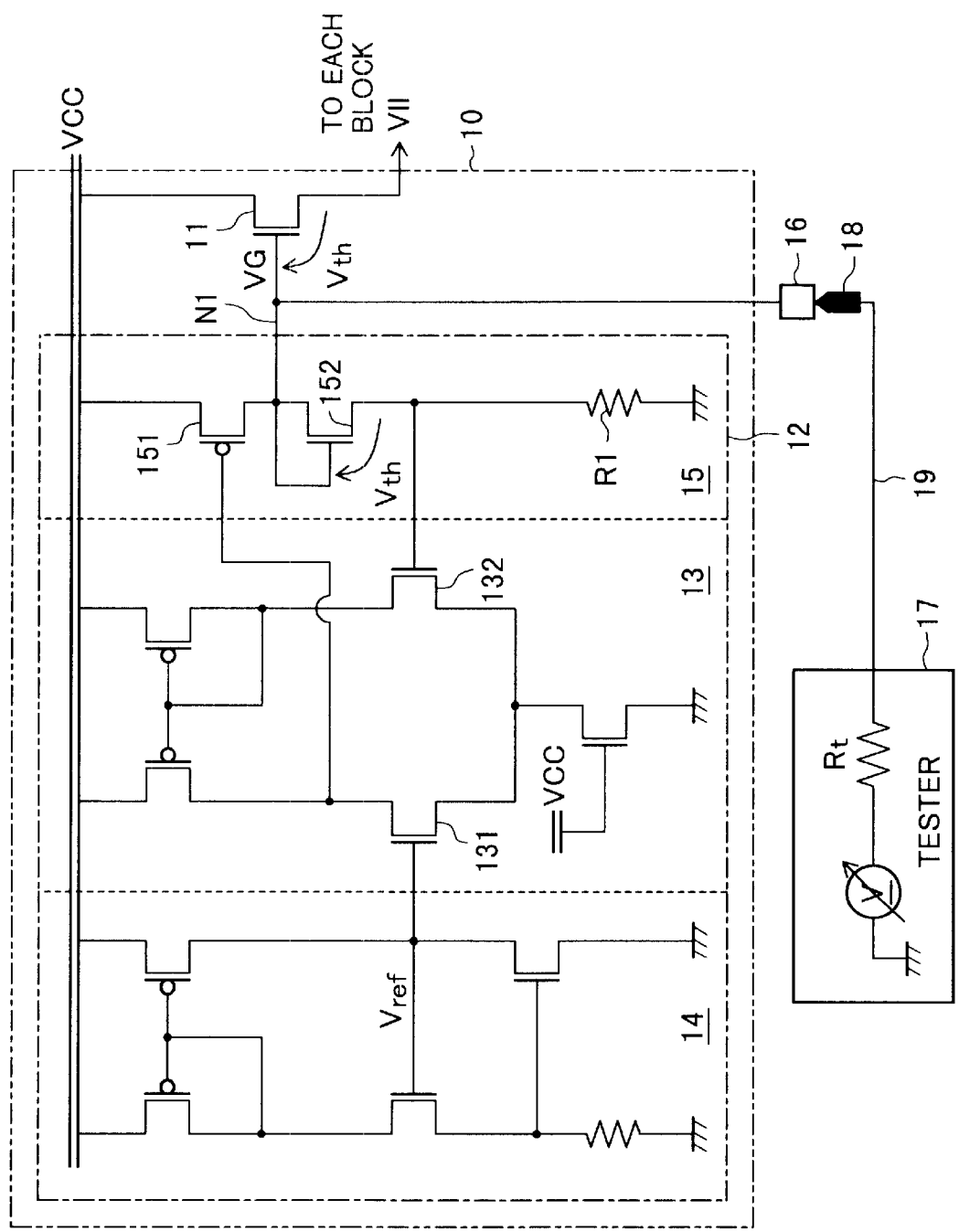
FIG. 5 is a diagram showing a prior art step-down circuit together with a tester.

The circuit 10A is included in a semiconductor device and used instead of a step-down circuit 10 of FIG. 5. The step-down circuit 10A includes the NMOS transistor 11 and the voltage control circuit 12 controlling the gate voltage VG of the NMOS transistor 11, which are the same as that of FIG. 5, and in addition to those, includes a voltage follower circuit 20A connected between the output of the voltage control circuit 12 and an on-chip pad 16A, and a voltage follower circuit 20B connected between the output of the reference voltage generation circuit 14 and an on-chip pad 16B. The voltage follower circuit 20A includes a differential amplification circuit 21 and an output buffer circuit 22 in the succeeding stage.

In the differential amplification circuit 21, the sources of NMOS transistors 211 and 212 are grounded through an NMOS transistor 213 as a current source. The drains of the NMOS transistors 211 and 212 are connected to the VCC through PMOS transistors 214 and 215, respectively. The gates of the PMOS transistors 214 and 215 are both connected to the drain of the PMOS transistor 215. Such a circuit is the same as the differential amplification circuit 13 of FIG. 5. In addition to those in the differential amplification circuit 21, PMOS transistors 216 and 217 are connected to the PMOS transistors 214 and 215, respectively, in parallel. A test mode signal TM is provided to the gates of the NMOS transistor 213, and the PMOS transistors 216 and 217, and the gate voltage VG is provided through the node N1 to the gate of the NMOS transistor 211, which is one of the inputs of the differential amplification circuit 21.

In the output buffer circuit 22, a PMOS transistor 221 and a resistor R2 are connected in series between the VCC and the ground conductor. The gate of the PMOS transistor 221 is connected to the drain of the NMOS transistor 211, which is the output of the differential amplification circuit 21. The drain of the PMOS transistor 221, which is the output node of the output buffer circuit 22, is connected to both the pad 16A and the gate of the NMOS transistor 212, which is the other input of the differential amplification circuit 21.

The voltage follower circuit 20B has the same configuration as that of the voltage follower circuit 20A, and the test signal TM is commonly provided to both.

Next, there will be described operation of the first embodiment configured as described above.

In FIG. 5, the node N1 is connected to the pad 16 having a comparatively large capacitance and therefore, a response speed in control of the voltage VG to a change of the voltage VII is reduced even in normal operation by a user. However, in FIG. 1, reduction in the response speed can be prevented since the node N1 is not connected to the pad 16A directly but to the gate of the NMOS transistor 211 having a much smaller capacitance than that of the pad 16A.

The signal TM is set high in a test prior to shipment of the semiconductor device in which the step-down circuit 10A is formed. Thereby, the PMOS transistors 216 and 217 are off, and the NMOS transistor 213 functions as a constant current source. Accordingly, the differential amplification circuit 21 operates similar to the differential amplification circuit 13 of FIG. 5.

As the gate voltage VG of the NMOS transistor 11, that is the gate voltage of the NMOS transistor 211, falls, the gate voltage of the PMOS transistor 221 rises, and the internal resistance thereof increases to lower the voltage of the pad 16A. As the gate voltage VG rises, the gate voltage of the PMOS transistor 221 falls and the internal resistance thereof decreases to raise the voltage of the pad 16A. By such operation, the voltage of the pad 16A follows the gate voltage VG so as to be equal thereto.

The resistance value of the resistor R2 is much smaller than those of the internal resistance Rt of the tester 17 and the resistor R1, and the current flowing through the resistor R2 is much larger than that flowing through the resistor R1.

For this reason, even when the probe 18 of the tester 17 is put into contact with the pad 16A through the cable 19, there arises almost no influence of the combined capacitance of the probe 18 and the cable 19 on change in the voltage of the pad 16A, which enables the gate voltage VG, equal to the voltage of the pad 16A, to be indirectly measured with accuracy by measuring the voltage of the pad 16A.

Since the current flowing through the resistor R2 is comparatively large, power consumption of the voltage follower circuit 20A is considerably larger than that of the voltage control circuit 12. However, in normal operation by a user, since the signal TM is set low, the NMOS transistor 213 is off and the PMOS transistor 216 is on, the gate of the PMOS transistor 221 is high, and the PMOS transistor 221 is off, therefore the voltage follower circuit 20A is deactivated. Hence, increase in power consumption can be avoided when in normal operation by a user although the voltage follower circuits 20A and 20B are included in the step-down circuit 10A.

The reason why the PMOS transistor 217 is in parallel connected to the PMOS transistor 215 is because it is prevented that when the signal TM is high and the PMOS transistor 216 is off, a parasitic capacitance of the PMOS transistor 216 is added only to the PMOS transistor 214, and thereby an operating characteristics of the differential amplification circuit 21 becomes asymmetric. In other words, because the voltage of the pad 16A can accurately follow the gate voltage VG.

Also, by contacting the probe 18 of the tester 17 with the pad 16B in the test mode, the reference voltage Vref can be accurately measured.

Second Embodiment

In FIG. 1, since the current flowing through the resistor R2 is comparatively large, the PMOS transistor 221 has to be comparatively large in size, thereby increasing an on-chip occupancy area of the step-down circuit 10A.

Figure 2:
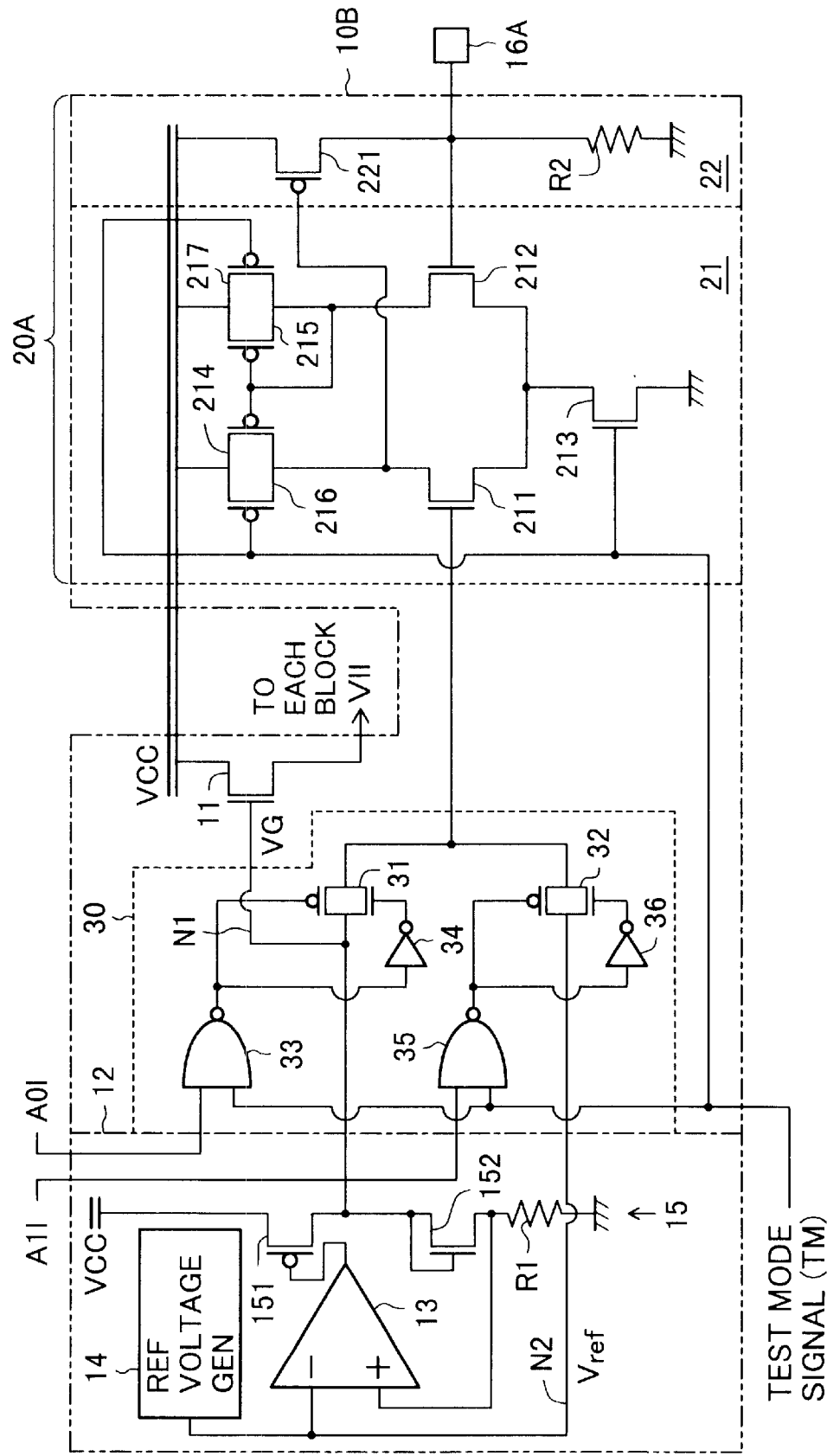
FIG. 2 is a diagram showing a step-down circuit of the second embodiment according to the present invention.

Therefor, in the second embodiment according to the present invention, as shown in FIG. 2, there is provided a selection circuit 30 for selecting one of the gate voltage VG and the reference voltage Vref and providing the selected voltage to the gate of the NMOS transistor 211 in the voltage follower circuit 20A, resulting in that the voltage follower circuit 20B of FIG. 1 is omitted. Thereby, the pad 16B of FIG. 1 is also unnecessary.

In the selection circuit 30, the node N1 of the voltage VG and the node N2 of the reference voltage Vref are commonly connected to the gate of NMOS transistor 211 through transfer gates 31 and 32, respectively. The transfer gates 31 and 32 are disposed near the NMOS transistor 11 and the output of the reference voltage generation circuit 14 in order to lessen the wiring capacitances of the nodes N1 and N2 by decreasing in length thereof. The transfer gate 31 is constructed of a PMOS transistor and an NMOS transistor connected in parallel to each other. To these gates of the PMOS and NMOS transistors, the output of a NAND gate 33 and its inverted signal by an inverter 34 are provided. Likewise, the output of a NAND gate 35 is provided to the gate of a PMOS transistor of the transfer gate 32, and the output of the NAND gate 35 is provided through an inverter 36 to the gate of an NMOS transistor of the transfer gate 32.

The test mode signal TM is provided to one inputs of the NAND gates 33 and 35, and select control signals A0I and A1I are provided to the other respective inputs thereof.

The other configuration of the step-down circuit 10B is the same as that of the step-down circuit 10A of FIG. 1.

In the above described configuration, in a test, the test mode signal TM is set high, and thereby the voltage follower circuit 20A and the selection circuit 30 are activated. When the gate voltage VG is indirectly measured from the pad 16A, the signals A0I and A1I are set high and low, respectively. Thereby, the transfer gates 31 and 32 are turned on and off, respectively, and the gate voltage VG of the NMOS transistor 11 is provided through the transfer gate 31 to the gate of the NMOS transistor 211. When the reference voltage Vref is indirectly measured from the pad 16A, the signals AOI and AII are set low and high, respectively. Thereby, the transfer gates 31 and 32 are turned off and on, respectively, and the output voltage Vref of the reference voltage generation circuit 14 is provided through the transfer gate 32 to the gate of the NMOS transistor 211.

In normal operation by a user, the test mode signal TM is set low, and thereby the voltage follower circuit 20A and the selection circuit 30 are both deactivated.

Figure 3:
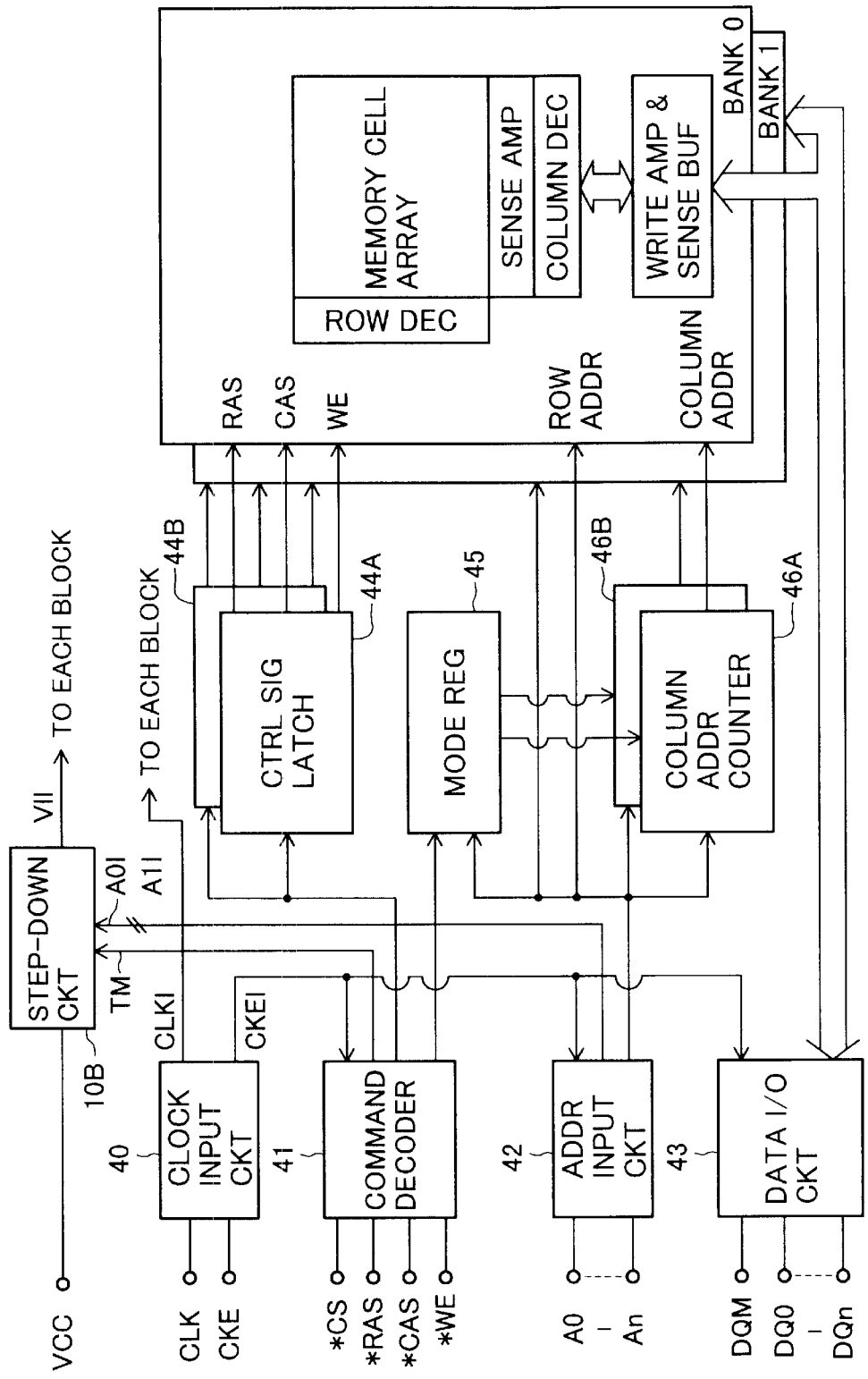
FIG. 3 is a block diagram of a synchronous DRAM including the circuit of FIG. 2.

The step-down circuit 10B is included in a synchronous DRAM as shown in FIG. 3, and the outline thereof will be described below.

A clock input circuit 40 outputs a clock CLK as an internal clock CLKI only when a clock enable signal CKE is high, and provides the signal CLKI to internal circuit blocks and further, provides an internal clock enable signal CKEI, obtained by amplification of a drive ability of the signal CKE, to a command decoder 41, an address input circuit 42 and a data input/output circuit 43. The circuits 41 to 43 are activated only when the internal clock enable signal CKEI is high.

The command decoder 41 decodes a combination value of a chip select signal *CS, a row address strobe signal *RAS, a column address strobe signal *CAS and a write enable signal *WE on the rise of the clock CLKI, and provides the result to control signal latch circuits 44A and 44B and a mode register 45. Signals RAS, CAS and WE from the control signal latch circuit 44A are provided to a bank 0, and signals RAS, CAS and WE from the control signal latch circuit 44B are provided to a bank 1.

The burst mode signal and so on from the command decoder 41 are set in the mode register 45.

The address input circuit 42 latches addresses A0 to An on the rise of the clock CLKI and provides the latched addresses to the row address inputs of the banks 0 and 1, the mode register 45, and column address counters 46A and 46B. When the decoded command is a mode setting command, part of the latched address is held as a mode setting value in the mode register 45. Further, the output of the address input circuit 42 is used as a row address for the bank 0 or 1 in response to activation of the signal RAS, and the output of the column address counter 46A or 46B is used as a column address for the bank 0 or 1 in response to activation of the signal CAS. The address input circuit 42 further selects the bank 0 or 1 according a value of the most significant bit An. In a case of the burst mode, the count of the column address counter 46A or 46B is incremented on the rise of the clock CLKI.

Read from or write operation of the band 0 or 1 is performed through a data input/output circuit 43.

There are unused available commands which are combination values of the input of the command decoder 41, and one of them is provided to the step-down circuit 10B as the test mode signal TM. When the signal TM is high, no access to the bank 0 or 1 is performed and therefore, the signals A0I and A1I, obtained by amplification of drive abilities of the addresses A0 and A1 in the address input circuit 42, are used as signals for the selection circuit 30 of FIG. 2.

According to such a configuration, any new external terminals for inputting the signals TM, A0I and A1I are not necessary to be provided, thus preventing increase in the number of external terminals.

Third Embodiment

Figure 4:
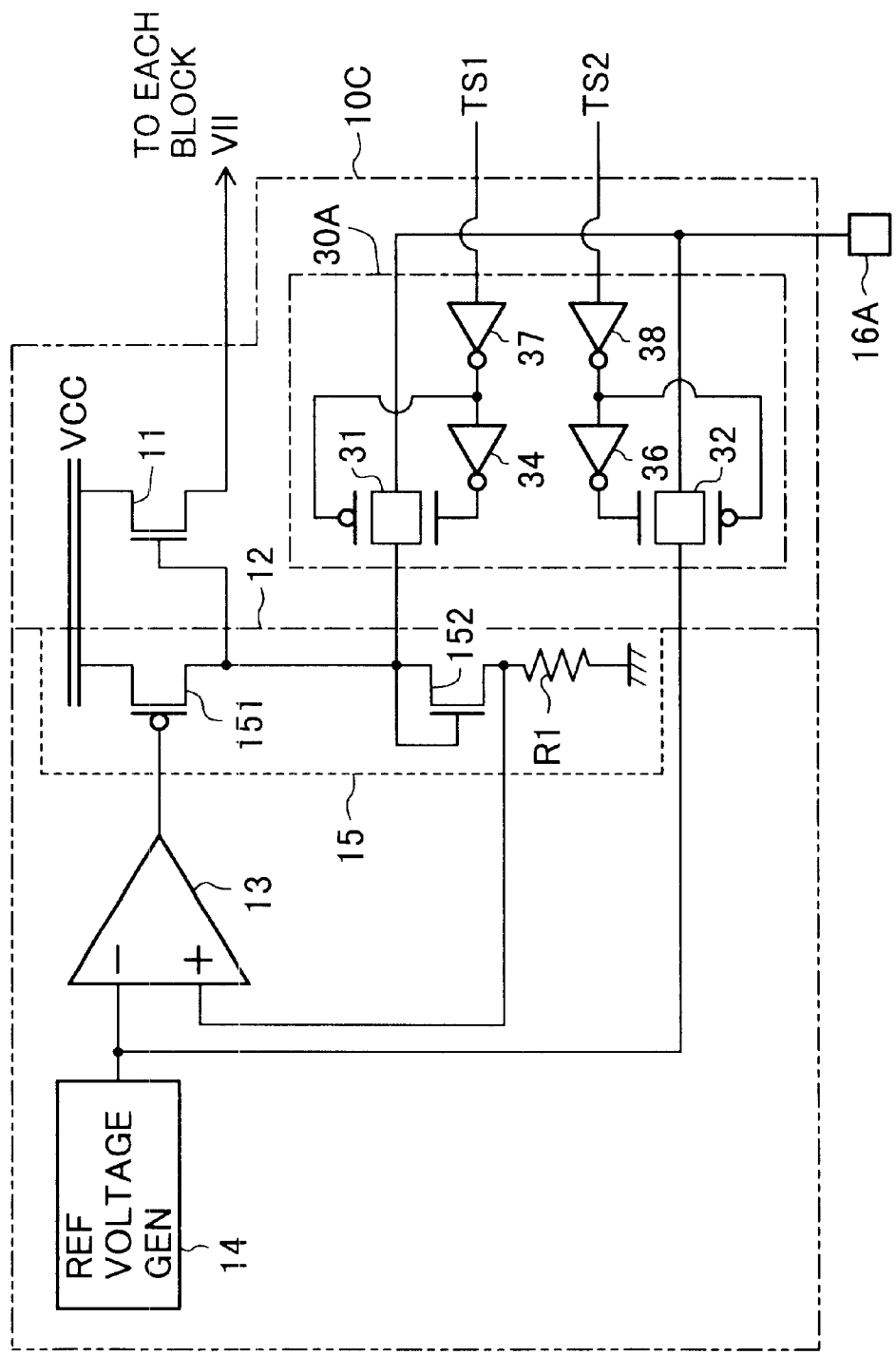
FIG. 4 is a diagram showing a step-down circuit of the third embodiment according to the present invention.

FIG. 4 shows a step-down circuit 10C of the third embodiment according to the present invention.

In this circuit, the voltage follower circuit 20A of FIG. 2 is omitted, and a selection circuit 30A is used instead of the selection circuit 30 of FIG. 2. In the selection circuit 30A, inverters 37 and 38 are used instead of the NAND gates 33 and 35, respectively, of the selection circuit 30 of FIG. 2, and select control signals TS1 and TS2 are provided to the inverter 37 and 38 instead of the signals A0I and A1I of FIG. 2, respectively.

The signals TS1 and TS2 are, for example, outputs of the command decoder 41 of FIG. 3, which correspond to unused available commands.

In normal operation by a user, both signals TS1 and TS2 go low to turn off the transfer gates 31 and 32.

In test, the signals TS1 and TS2 are set high and low, respectively, by a first test command to turn on the transfer gate 31 and off the transfer gate 32, while the signals TS1 and TS2 are set low and high, respectively, by a second test command to turn off the transfer gate 31 and on the transfer gate 32.

Although preferred embodiments of the present invention has been described, it is to be understood that the invention is not limited thereto and that various changes and modifications may be made without departing from the spirit and scope of the invention.

For example, the selection circuit may be for selecting one of three or more node voltages to be measured in a test. In this case, output lines of the address decoder may be employed as select control signals.

Further, the test circuit of the present invention is applicable for measurement of a node voltage of an internal circuit in any semiconductor device.

When measuring a node current, the test circuit of the present invention can be applied to a voltage converted from the node current, wherein the converted voltage is "a node to be measured" recited in the claims.

What is claimed is:

1. A semiconductor device comprising:
   an internal circuit having a node with a voltage to be measured in a test;
   an on-chip terminal; and
   a voltage follower circuit, having an input for receiving said voltage at said node, activated in response to activation of a test mode signal, having an output connected to said on-chip terminal, and not having a current path between said input and said output.

2. The semiconductor device according to claim 1, wherein said nodes include first and second nodes, said semiconductor device further comprises:
   a selection circuit for selectively providing one of the voltages at said first and second nodes to said input of said voltage follower circuit depending on a selection signal.

3. The semiconductor device of claim 1, wherein said internal circuit comprises:
   an FET, for stepping down an external power supply voltage to an internal power supply, having a gate electrode as said first node.

4. The semiconductor device of claim 3, wherein said internal circuit further comprises:
   a voltage control circuit for controlling a voltage of said gate to be equal to a reference voltage, said reference voltage being applied to said second node.

5. The semiconductor device of claim 4, further comprising:

a synchronous DRAM circuit including: a command decoder, receiving input signals, for generating said test mode signal which is activated according to said input signals.

6. The semiconductor device of claim 1, wherein said voltage follower circuit comprises:

a differential amplification circuit for amplifying a difference between a voltage of said input of said voltage follower circuit and a voltage of said on-chip terminal with a current flowing through itself only when said test signal is active; and an output buffer circuit having a transistor and a resistor connected in series between first and second power supply voltages, said transistor having a control input, said control input receiving an output voltage of said differential amplification circuit, a connection node of said transistor and said resistor being connected to said on-chip terminal, said transistor being turned off in response to deactivation of said test mode signal.

7. The semiconductor device of claim 3, wherein said voltage follower circuit comprises:

a differential amplification circuit for amplifying a difference between a voltage of said input of said voltage follower circuit and a voltage of said on-chip terminal with a current flowing through itself only when said test signal is active; and an output buffer circuit having a transistor and a resistor connected in series between first and second power supply voltages, said transistor having a control input, said control input receiving an output voltage of said differential amplification circuit, a connection node of said transistor and said resistor being connected to said on-chip terminal, said transistor being turned off in response to deactivation of said test mode signal.

8. The semiconductor device of claim 2, wherein said internal circuit comprises:

an FET, for stepping down an external power supply voltage to an internal power supply, having a gate electrode as said first node.

9. The semiconductor device of claim 8, wherein said internal circuit further comprises:

a voltage control circuit for controlling a voltage of said gate to be equal to a reference voltage, said reference voltage being applied to said second node.

10. The semiconductor device of claim 9, further comprising:

a synchronous DRAM circuit including: a command decoder, receiving input signals, for generating said test mode signal which is activated according to said input signals.

11. The semiconductor device of claim 10, wherein said selection signal includes said test mode signal and first and second bit signals for memory addressing, wherein said selection circuit includes:

a first transfer gate having an input connected to said first node, an output connected to said input of said voltage follower circuit, and a control input;

a second transfer gate having an input connected to said second node, an output connected to said input of said voltage follower circuit, and a control input;

a first logic circuit having first and second inputs and an output, said first and second inputs thereof receiving said first bit signal and said test mode signal, respectively, said output thereof being connected to said control input of said first transfer gate; and a second logic circuit having first and second inputs and an output, said first and second inputs thereof receiving said second bit signal and said test mode signal, respectively, said output thereof being connected to said control input of said second transfer gate.

12. The semiconductor device of claim 2, wherein said voltage follower circuit comprises:

a differential amplification circuit for amplifying a difference between a voltage of said input of said voltage follower circuit and a voltage of said on-chip terminal with a current flowing through itself only when said test signal is active; and an output buffer circuit having a transistor and a resistor connected in series between first and second power supply voltages, said transistor having a control input, said control input receiving an output voltage of said differential amplification circuit, a connection node of said transistor and said resistor being connected to said on-chip terminal, said transistor being turned off in response to deactivation of said test mode signal.

13. The semiconductor device of claim 8, wherein said voltage follower circuit comprises:

a differential amplification circuit for amplifying a difference between a voltage of said input of said voltage follower circuit and a voltage of said on-chip terminal with a current flowing through itself only when said test signal is active; and an output buffer circuit having a transistor and a resistor connected in series between first and second power supply voltages, said transistor having a control input, said control input receiving an output voltage of said differential amplification circuit, a connection node of said transistor and said resistor being connected to said on-chip terminal, said transistor being turned off in response to deactivation of said test mode signal.

* * * * *